United States Patent [19]

Ziegler et al.

[11] 4,044,456
[45] Aug. 30, 1977

[54] METHOD FOR THE MANUFACTURE OF A SUPERCONDUCTOR WITH A SUPERCONDUCTIVE INTERMETALLIC COMPOUND OF AT LEAST TWO ELEMENTS

[75] Inventors: Günther Ziegler; Sigrun Frohmader, both of Erlangen; Manfred Wilhelm, Nurnberg, all of Germany

[73] Assignee: Siemens Aktiengesellschaft, Munich, Germany

[21] Appl. No.: 573,073

[22] Filed: Apr. 30, 1975

[30] Foreign Application Priority Data

May 16, 1974 Germany .............................. 2423882

[51] Int. Cl.$^2$ ............................................ H01V 11/00
[52] U.S. Cl. ..................................................... 29/599
[58] Field of Search ............................................. 29/599

[56] References Cited

U.S. PATENT DOCUMENTS

| 3,268,362 | 8/1966 | Hanak et al. | 29/599 UX |
|---|---|---|---|
| 3,281,738 | 10/1966 | Hanak | 29/599 UX |
| 3,342,707 | 9/1967 | Bode | 29/599 |
| 3,397,084 | 8/1968 | Krieglstein | 29/599 UX |
| 3,425,825 | 2/1969 | Wilhelm | 29/599 X |
| 3,449,092 | 6/1969 | Hammond | 29/599 X |
| 3,525,637 | 8/1970 | Kim | 29/599 X |
| 3,578,496 | 5/1971 | Ziegler et al. | 29/599 |
| 3,595,693 | 7/1971 | Cecil et al. | 29/599 |
| 3,728,165 | 4/1973 | Howlett | 29/599 |
| 3,829,963 | 8/1974 | McDougall et al. | 29/599 |
| 3,838,503 | 10/1974 | Suenaga et al. | 29/599 |

FOREIGN PATENT DOCUMENTS

| 19,541 | 1970 | Japan | 29/599 |

*Primary Examiner*—C.W. Lanham
*Assistant Examiner*—V. Rising
*Attorney, Agent, or Firm*—Kenyon & Kenyon, Reilly, Carr & Chapin

[57] ABSTRACT

A method for the manufacture of a superconductor with a superconductive intermetallic compound consisting of at least two chemical elements in which a ductile structural part made of at least one element of the compound is brought into contact with a second structural part which contains a ductile carrier metal for the remaining elements of the compound after which the remaining elements of the compound are admitted to the second ductile structural part through a chemical transport reaction at elevated temperature, the compound being formed by a reaction of its remaining elements, diffusing through the second structural part, with the first structural part.

28 Claims, 6 Drawing Figures

METHOD FOR THE MANUFACTURE OF A SUPERCONDUCTOR WITH A SUPERCONDUCTIVE INTERMETALLIC COMPOUND OF AT LEAST TWO ELEMENTS

BACKGROUND OF THE INVENTION

The invention relates to a method for the manufacture of a superconductor with a superconductive intermetallic compound consisting of at least two elements in general and more particularly to such a method wherein a ductile structural part made of at least one element of the compound is brought into contact with a second structural part which contains a carrier metal for the remaining elements of the compound; the remaining elements of the compound are subsequently admitted to the second ductile structural part at elevated temperature; and the compound is formed by a reaction of its remaining elements, which diffuse through the second structural part, with the first structural part.

Superconductive intermetallic compounds of the type $A_3B$, consisting of two elements, for example, $Nb_3Sn$ or $V_3Ga$, which have an A-15 crystal structure exhibit very good superconductor properties being particularly distinguished by a high critical magnetic field, a high transition temperature and a high critical current density. As a result, they are particularly well suited as superconductors for superconducting coils used to generate strong magnetic fields such as are needed for research purposes. Other possible applications include superconducting magnets for the suspension guidance of magnetic suspension railroads and the windings of electric machines. Recently, ternary compounds such as niobium-aluminum-germanium ($Nb_3Al_{0.8}Ge_{0.2}$) have also become of special interest. However, since these compounds are very brittle, their manufacture in a form suitable, for example, for use in magnet coils presents considerable difficulties. Several methods of manufacturing superconductors in the form of long wires or ribbons with, in particular, two-component intermetallic compounds have been disclosed. These methods are used particularly for the manufacture of what are known as multi-core conductors. Such conductors have wires, typically of $Nb_3Sn$ or $V_3Ga$, arranged in a normal-conducting matrix. In the known methods, a ductile element, in wire form, of the compound to be prepared, e.g., a niobium or vanadium wire, is surrounded with a sleeve of an alloy containing a ductile carrier metal and the remaining elements of the compound, e.g., a copper-tin alloy or a copper-gallium alloy. In particular, a multiplicity of such wires are embedded in a matrix of the alloy. The structure so obtained is then subjected to cross-section reducing processing to obtain a long wire such as is required for coils. As a result the diameter of the wires, e.g., niobium or vanadium wire, for example, is reduced to a small value in the order of magnitude of about 30 to 50 μm or even less, which is desirable in view of the superconduction properties of the conductor. Through the cross-section reducing processing attempts are also made to obtain the best possible metallurgical bond between the wire and the surrounding matrix material of the alloy without, however, the occurrence of reactions which lead to embrittlement of the conductor. After the cross-section reducing processing, the conductor, consisting of one or more wires and the surrounding matrix material, is subjected to a heat treatment such that the desired compound is formed by a reaction of the wire material, i.e., the niobium or vanadium, for instance, with the further element, contained in the surrounding matrix, of the compound, e.g., tin or gallium. In this process, the element contained in the matrix diffuses into the wire material, which consists of the other element of the compound, and reacts therewith forming a layer consisting of the desired compound. (See United Kingdom Pat. Spec. No. 1,280,583 and 1,335,447; U.S. Pat. No. 3,728,165).

However, these known methods are not fully satisfactory for a number of reasons. First, the diffusion process in these methods cannot be carried out so that all the gallium or tin present in the matrix is used up to form the intermetallic compound. It is therefore not possible to build up $V_3Ga$ or $Nb_3Sn$ layers of any desired thickness. Rather, the diffusion of gallium or tin toward the vanadium or niobium cores will terminate when the activity of the elements gallium and tin in the copper matrix is equal to their activity in the intermetallic compounds $V_3Ga$ or $Nb_3Sn$ produced. In other words, no further $V_3Ga$ or $Nb_3Sn$ will be formed when the concentration of the gallium or the tin in the copper matrix has dropped to a given value because of the inward diffusion of gallium or tin into the cores. If, for instance, gallium is diffused from a copper-gallium matrix with 18 atom percent of gallium into vanadium cores at a temperature of about 700° C, the equilibrium state mentioned, at which no further formation of $V_3Ga$ takes place, is reached when the gallium content of the matrix has dropped to about 12 atom percent. This means that only about 38% of the gallium available in the matrix is converted into $V_3Ga$. The thickness of the $Nb_3Sn$ or $V_3Ga$ layers formed in a multi-core conductor depends therefore not only on the annealing time, the annealing temperature and the composition of the copper-gallium or the copper-tin alloy, but also on the total amount of tin or gallium available for each core, i.e., on the volume of the part of the matrix available for each individual core.

However, in order to obtain a high effective critical current density, i.e., a high critical current density referred to the total conductor cross section, it is necessary that the greatest possible layer thickness of the intermetallic compound to be produced. With the known methods described above this can be achieved only by making the ratio of the matrix share to the core share of the total cross section area of the conductor such that the growth of the layer is not limited by a limited supply of gallium or tin, i.e., a core spacing as large as possible is necessary. However, in a multi-core conductor of given cross section this requirement can be met only by either drawing out the core, for a fixed number of cores, to a very thin size during the cross-section reducing process steps, or by reducing the number of cores, if the core cross section is fixed. Neither solution is very satisfactory since, on the one hand, the drawing of the cores into extremely thin filaments presents considerable difficulties and is expensive and, on the other hand, if the number of cores is reduced, the effective current density decreases and, as a rule, is only just compensated by the thicker diffusion layer which can possibly be obtained. An arbitrary increase of the core spacings, finally, is also not possible for reasons of forming technology. For instance, if a larger number of vanadium or niobium cores is to be drawn to a uniform thinness so that their cross sections remain equal, then the core spacing must not be too great.

A further difficulty with the known methods is that the matrix material containing the embedded cores, consisting of the carrier metal and the remaining elements of the compound to be produced, is relatively difficult to deform, particularly for higher concentrations of these elements. These matrix materials have, in particular, harden quickly through cross-section reducing cold working and can then be deformed further only with great difficulty. It is therefore necessary in these methods to subject the conductor structure consisting of the cores and the matrix material to intermediate anneals for recovery and recrystallization of the matrix structure which has become brittle during the cold-working even after relatively small deformation steps. Although these annealing treatments can be performed at temperatures and annealing times at which, as a rule, is below that at which the superconductive compound to be produced is formed, they are time-consuming because of their frequent repetition. This increasingly difficulty in deforming the matrix material with increasing content of the remaining elements of the compound to be produced is, finally, also a reason why the concentration of, for instance, gallium or tin cannot simply be increased arbitrarily in the matrix in order to obtain heavier layers of the compound to be produced. Furthermore, with increasing concentration of these elements, the melting point of the matrix material drops. For very high concentrations, this leads to problems in the heat treatment for forming the intermetallic compound. Furthermore, if the concentration is too high these elements can form undesirable intermetallic phases with the carrier metal.

Proposed methods are also known in which the repeated intermediate anneals mentioned are eliminated. In these methods one or more cores of a ductile element of the compound to be produced, particularly niobium or vanadium, are embedded in a ductile matrix material, e.g., copper, silver or nickel, which contains, at most, only very small amounts of the element of the compound to be produced. The structure consisting of the cores and this matrix material can then be processed without any intermediate anneal by a cross-section reducing process, e.g., by cold-drawing, into a thin wire which contains very thin cores of vanadium or niobium. After the last cross-section reducing process step, the remaining elements of the compound to be produced, e.g., tin in the case of $Nb_3Sn$, are then applied to the matrix material. This is done by briefly immersing the wire in a tin melt, so that a thin tin layer is formed on the matrix material, or by evaporating a tin layer on the matrix material. Subsequently, a heat treatment is performed, in which the elements of the compound to be produced, which have been applied to the matrix material, are first diffused into the matrix material and then through it, and then form the desired superconductive compound through reaction with the cores (see "Applied Physics Letters" vol. 20 (1972), pages 443 to 445; U.S. Pat. No. 3,829,963).

However, only relatively small amounts of an element such as tin can be applied to the matrix which, for instance, consists of copper, since in applying larger amounts of tin an undesirable, brittle intermediate phase of copper and tin can readily form at the temperature necessary for diffusing the tin into the copper matrix. After excessive amounts of tin have been diffused into the matrix, the tin itself or a surface area of the matrix can melt and in the process can easily drip or run off from the matrix surface. Therefore, in this method also, only a limited amount of the lower melting temperature element, e.g., tin, is available for the formation of the desired intermetallic compound, e.g., $Nb_3Sn$. In U.S. Pat. No. 3,829,963 it is suggested that, if desired, all the niobium contained in the copper matrix can also be converted into $Nb_3Sn$, if the individual process steps for coating the matrix with tin are repeated often enough to obtain the subsequent formation and homogenization of the copper-tin matrix and for reacting the tin contained in the matrix with the niobium core. However, such a method is extremely expensive because of the large number of process steps required.

In U.S. Pat. No. 3,829,963 a continuous method for the manufacture of $Nb_3Sn$ multi-core conductors, in which a conductor structure in wire form, consisting of a copper matrix and embedded niobium cores, is continuously conducted through an oven, in which several containers with melted tin are arranged side by side is also described. The parts of the interior of the oven located above the respective containers are traversed by the conductor structure sequentially. The first tin melt, through whose associated vapor space the conductor structure first runs, is at a temperature of 1500° C, and the other tin melts, through whose vapor spaces the conductor structure runs subsequently, are at a temperature of 1000° C. The conductor itself is kept at a temperature of 850° C by the oven. As described in the U.S. Pat. No. 3,829,963 the tin vapor pressure in the vapor space above the first tin melt which is at a temperature of 1500° C, must be high enough so that the transfer and deposition rate of the tin exceeds the solid diffusion rate of the tin into the copper matrix to cause a tin concentration gradient to build up rapidly transversely across the wire radius. The conductor structure in wire form is kept over the tin melt of higher temperature until sufficient tin for the formation of the desired mean matrix composition is applied. As also stated in U.S. Pat. No. 3,829,963 the tin vapor pressure in the vapor spaces above the tin melts which are at a temperature of 1000° C, through which the conductor structure runs subsequently, must be just large enough so that the tin supply rate is reduced to a value at which tin diffuses through the copper matrix and arrives through solid diffusion at the surface of the niobium cores. The solid diffusion itself takes place at a temperature of 850° C. This temperature is chosen considerably lower than the temperature of the tin melts in order to prevent re-evaporation of the tin from the matrix and melting of the matrix. This method is also extremely expensive because of the three different temperatures required for the tin melts and the conductor structure itself, all of which must be maintained accurately during the relatively laborious process. Furthermore, the temperatures of 1500° and 1000° C, respectively, required for the tin melts, are uncomfortably high with regard to the stresses of the container material that occur. In addition, it is difficult to reproducibly achieve a desired, given concentration of tin in the copper matrix in the vapor space above a tin melt.

SUMMARY OF THE INVENTION

It is an object of the invention to further improve the manufacture of a superconductor with a superconductive intermetallic compound consisting of at least two elements, in which a ductile structural part mode of at least one element of the compound is first brought into contact with a second structural part which contains a ductile carrier metal of the remaining elements of the compound; the remaining elements of the compound are subsequently admitted to the second ductile structural part at elevated temperature; and the compound is formed by a reaction of its remaining elements which diffuse through the second structural part, with the first structural part. In particular, in accordance with the present invention such a method is simplified further by a simultaneously lowering of the temperatures required and an increase in the reproducibility, without the occurrence of a limitation on the layer thickness of the superconductive intermetallic compound to produced in the process. In addition, to the extend necessary, the advantages which are offered by a ductile matrix material which can be cold-formed without intermediate anneals are retained.

According to the present invention, this is accomplished by admitting the remaining elements to the second ductile structural part through a chemical transport reaction.

Chemical transport reactions themselves are known and are characterized by the feature that a solid or liquid substance reacts with gases, forming only gaseous reaction products, and that subsequently, at other points of the system, a reverse reaction takes place, the starting substance being precipitated. A condition for a chemical transport reaction is, besides the reversibility of the chemical reaction that takes place, the presence of a concentration gradient between the point at which the gaseous reaction products are formed and the point where the reverse reaction through decomposition of these reaction products is to take place (see H. Schaefer, "Chemical transport reactions", Weinheim/Bergstr., Verlag Chemie, 1962, page 11).

In comparison to the known methods, a large number of advantages is obtained by the use, according to the present invention, of chemical transport reactions for supplying the remaining elements of the compound to be produced to the second ductile structural part. For one, it has been found that no temperature substantially exceeding the temperature required for the formation of the superconductive intermetallic compounds themselves are required for chemical transport reactions. In addition, predetermined quantities of the remaining elements of the compound to produced can be supplied in a simple manner to the second ductile structural part of the conductor structure to be treated by means of chemical transport reactions.

The method according to the present invention is suited for the manufacture of superconducting components structures of different forms, as long as they only have a layer of a superconductive intermetallic compound consisting of at least two elements or consist entirely of such a compound.

However, the method of the present invention is preferably used for the manufacture of multi-core conductors. To this end, several cores i.e. structural parts of the first element can advantageously first be embedded in a matrix material i.e. the second structural part, and processed, together with the latter, in a cross-section reducing manner. After the last cross-section reducing process step, the chemical transport reaction is them performed. The method of the present invention is particularly well suited for the manufacture of a superconductor with a compound of the type $A_3B$, consisting of two elements, with A-15 crystal structure. In the preparation of such compounds, the first structural part consists of the higher melting point element of the compound, while the lower melting point element is supplied by the transport reaction.

Particularly good cold workability of the conductor structure consisting of the first and the second structural parts obtained where the second structural part consists only of the carrier metal for the remaining elements of the compound to be produced. In such a case, the entire required amount of the remaining elements are supplied by the chemical transport reaction. This may take relatively long, particularly if for the formation of thick layers of the intermetallic compound to be produced, larger quantities of the remaining elements must be supplied. The reaction times required can be shortened if the second component, in addition to the carrier metal, also contains a share of the remaining elements of the compound to be produced. If good cold workability of the second structural part is desired, this share, however, should not be too large.

Copper is particularly well suited as the carrier for the second structural part. Optionally, silver or a ductile alloy of copper and silver along with other ductile elements which will permit sufficient diffusion of the remaining elements of the compound to be produces to the first, structural part and neither react adversely with the elements of the compound to be produced nor have an interfering effect on the chemical transport reaction can also be used.

The chemical transport reaction can be carried out, as will be explained below, in either a closed system or an open system.

In the chemical transport reaction, the source for the element to be transported and the conductor structure containing the second ductile structural part may be at different temperatures, so that the transport of matter takes place along a temperature gradient. However, it is particularly advantageous, to keep the source for the element to be transported and the conductor structure containing the second ductile structural part at least approximately at the same temperature during the transport reaction of the present invention. Surprisingly, such a transport or matter without a temperature gradient has been found possible. Apparently this is because different reaction equilibria adjust themselves during a transport reaction at the source for the element to be transported and at the surface, which consists preferably of copper, of the conductor structure receiving this element when both are at the same temperature. This ability to operate at a practically uniform temperature greatly simplifies the method of the present invention. In particular, the temperature along the conductor structure to be treated can be kept constant more easily when only one temperature is required for carrying out the reaction. In the method of the present invention a temperature as constant as possible along the entire conductor structure is desirable so that the same reaction conditions prevail along the entire conductor.

The method of the present invention is extraordinarily well suited for the manufacture of superconductors with the intermetallic compound $Nb_3Sn$. For manufacturing a superconductor with this compound, it is advantageous to start out with a structure whose first structural part consists of niobium and whose second structural part conists of copper with 0 to 8.5 atom percent, and preferably 0 to 4 atom percent, of tin. If good cold workability of the second structural part is desired, the tin content should not be higher than 4 atom percent. Although various transport means, for instance, even water, can be considered for the transporting of tin, chlorine has been found to be particularly well since it permits high transport rates. It is particularly advantageous to introduce the chlorine into the reaction chamber in the form of hydrochloric acid (hydrogen chloride). For the preparation of $Nb_3Sn$ the transport reaction can be performed particularly advantageously in the temperature range between 700° and 800° C, temperatures of 750° C and higher, in particular, are also sufficient for the formation of the compound $Nb_3Sn$ itself.

The method of the present invention is also extremely well suited for the manufacture of a superconductor with the intermetallic compound $V_3Ga$. For the manufacture of such a superconductor the first structural part can advantageously consist of vanadium and the second structural part of copper with 0 to 23 atom percent of gallium. If good cold workability of the second structural part is desired, it should contain not more than 15 atom percent of gallium. A particularly high cold workability with a cross section reduction of up to about 99% can be obtained if the gallium content of the second structural part is at most 12 atom percent. Iodine has been found particularly suitable as the transport agent for the gallium. The latter can be introduced into the reaction chamber particulrly advantageously in the form of copper iodide (CuI), which can be handled and measured out much more simply than, for instance, iodine compounds of gallium or elemental iodine. For manufacturing a conductor with the compound $V_3Ga$, the transport reaction is preferably carried out, in a temperature range between 450° C and 700° ; at temperatures of about 660° C and higher, the intermetallic compound $V_3Ga$ is also formed.

In order to achieve a concentration of the element to be transported in the material of the second structural part which is as uniform as possible even in a conductor structure of greater length, it is particularly advantageous to distribute the source for the element to be transported as uniformly as possible over the reaction chamber in such a manner that the transport paths to the different parts of the conductor structure containing the second structural part are about equally long. In this connection, it has been found to be particularly advantageous if the source for the element to be transported surrounds the conductor structure in tubular fashion. This is possible because not only the element to be transported itself, which as a rule melts at the temperatures to be used, but also alloys of this element with other metals are suitable as the source.

In order to prevent the formation of undesirable brittle phases it has further been found advantageous to conduct the transport reaction such that the second element is transported to the surface of the second structural part only in such amounts as can diffuse into the second structural part, forming or maintaining a homogenous, single phase alloy.

In the simplest form of the method according to the present invention the transport reaction can be carried out at a temperature above the formation temperature of the intermetallic compound to be produced and can be maintained until the desired layer thickness of the compound to be produced is attained.

Another possibility includes performing an additional heat treatment, in an inert atmosphere after the completion of the transport reaction, to enlarge the formed layers of the intermetallic compound. During this heat treatment, the element transferred during the transport reaction is not supplied.

A further possibility for carrying the method according to the present invention in which, in a first phase of the transport reaction, at a temperature below the formation temperature of the compound, the second structural part is enriched with the second element of the compound, after which the compound is formed in a second phase at a temperature above the formation temperature of the compound, while the supply of the second element is continued.

The cores of the multi-core conductor to be manufacture by the method of the present invention, incidentally, need not consist completely of at least one ductile element of the compound, i.e., of vanadium or niobium, for instance. The cores may instead have an interior portion of an electrically and thermally highly conductive metal which is a normal conductor at the operating temperature of the superconductor, e.g., copper, which is used for the stabilization. Then, only a sheath enclosing this interior portion will consist of at least one element of the compound.

BREIF DESCRIPTION OF THE DRAWINGS

DETAILED DESCRIPTION OF THE PRESENT INVENTION

The invention will now be described in detail with the aid of the following examples.

EXAMPLE 1

In this example, the manufacture of an $Nb_3Sn$ multi-core conductor by means of a transport reaction in a closed system will be explained more fully. The disclosed reaction uses hydrochloric acid gas as the transport medium.

Figure 1:
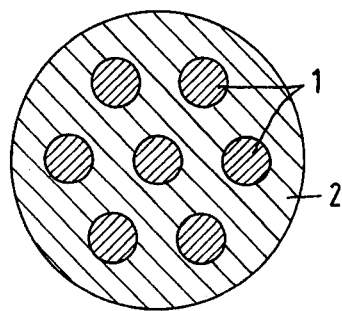
FIGS. 1 and 2 are schematic cross sections of a conductor structure for a multi-core conductor manufactured by the method of the present invention before and after the intermetallic compound is formed.

A conductor structure of the type shown in FIG. 1 was prepared in such a manner that a niobium rod was first placed in a copper tube and this rod was then drawn into a long wire without intermediate anneal. 19 sections of this wire were then combined in a bundle and again placed in a copper tube. The structure obtained in this manner was then cold-drawn a number of times until a conductor structure of the form shown in FIG. 1 was obtained, in which the nineteen individual niobium cores 1 had a diameter of about 20 μm and the copper matrix 2 a diameter of about 200 μm. For reasons of clarity, only seven niobium cores are shown in FIG. 1 rather than the 19 contained in the conductor structure described.

Figure 2:
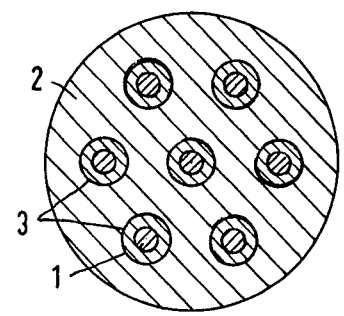
Figure 3:
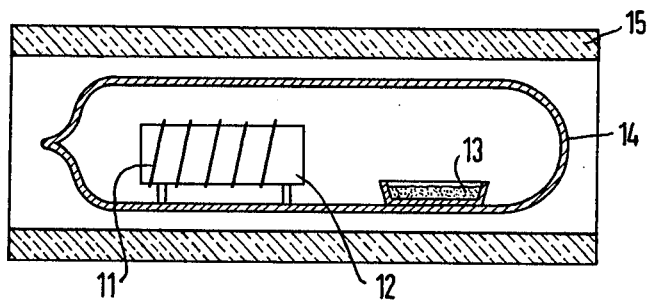
FIGS. 3 to 6 are schematic illustrations of different embodiments of apparatus for carrying out the method of the present invention.

A section 11 of this conductor structure 14 cm long was then wound on a ceramic tube 12, as shown in FIG. 3, and the latter, together with a tin supply 13, was placed in a quartz ampoule 14. The tin supply consisted of about 0.5 to 1 g of baked out tin granules; in the melted condition the tin surface was about 1 $cm^2$. The ampoule 14 was about 12 cm long and had an inside diameter of about 30 mm, i.e., a volume of about 100 $cm^3$. The ampoule 14 was subsequently evacuated to a residual gas pressure of about $10^{-6}$ Torr. Then the ampoule was filled with hydrochloric acid gas with a pressure of about 0.05 Torr at room temperature and sealed. The sealed ampoule was placed in a tubular furnace 15 and heated there for 16 hours to a temperature of about 750° C, whereby tin was transferred by a chemical transport reaction from the tin supply 13 to the conductor structure 11. The ampoule was subsequently cooled down and the conductor structure taken out. Examination of the conductor structure showed that through the transport reaction a quantity of tin of about 28 mg was transferred to the conductor structure 11 and the copper matrix of the conductor structure was converted into homogeneous α-phase of the alloy system copper-tin. At the same time as shown on FIG. 2, $Nb_3Sn$ layers 3, about 1 to 2 μm thick, were formed on the surface of each individual niobium core 1.

To elarge the $Nb_3Sn$ layers formed, the conductor structure was subsequently subjected to a heat treatment of several hours at a temperature of about 750° C in an inert atmosphere, e.g. argon, during which more tin diffused from the copper-tin matrix 2 into the niobium cores 1 and formed $Nb_{23}Sn$ with the niobium.

Surprisingly, the tin transport comes about in this method in spite of the equality of the temperatures of the tin source and the conductor structure. This can apparently be explained by the fact that the equilibrium of the transport reaction, which at the point of the tin source is located on the side of the tin chloride formation, is displaced in the vicinity of the conductor structure to the side of the liberation of tin, due to the alloy formation of the tin with the copper. Thereby, a concentration gradient between the points of the forward and the reverse reaction adjusts itself even without a temperature difference. Such a case can be referred to as a "reactive transport reaction".

The amount of hydrochloric acid, i.e., the quantity of the transport agent, is chosen small enough in this example that no brittle, tin-rich copper-tin phases are formed by too rapid a tin transport. The latter would be the case, for instance if the ampoule were filled, under conditions otherwise the same with hydrochloric acid gas with a pressure of 3 Torr. Instead of 28 mg of tin, 142 mg of tin would then be transferred by the transport reaction.

The simple experimental arrangement shown in FIG. 3 still has the disadvantage that somewhat more tin is supplied to the parts of the conductor structure 11 which are close to the tin supply 13 than to the parts which are further away from the tin supply 13. This is disadvantageous particularly in the manufacture of long wire lengths, such as are required for superconductor coils. This can be remedied, however, by making the gas atmosphere in the ampoule turbulent, for instance, by means of a small blower which is arranged in the ampoule and is driven from the outside via a magnetic coupling, so that a gas flow from the source to the conductor structure and back is produced. Even simpler, however is a uniform tin supply distributing the source of the tin to be transported within the ampoule as uniformly as possible in such a manner that the transport paths to different parts of the conductor structure are of about equal length.

Figure 4:
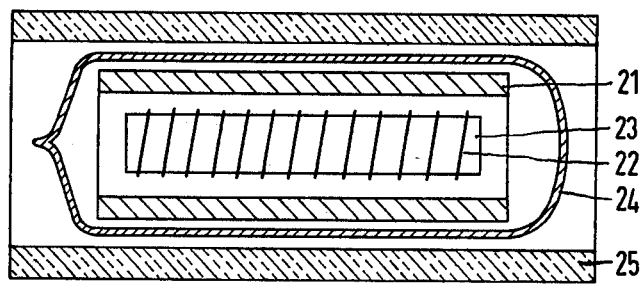

FIG. 4 shows an arrangement, in which the tin source 21 surrounds the conductor structure 23 in tubular fashion in a particularly advantageous form. The conductor structure 22 is again wound on a ceramic tube 23 and, together with the tin source 21, is arranged in an ampoule 24 which is located in a tubular furnace 25. In this case, the tin source 21 can, of course, not consist of pure tin since it would melt when the ampoule is heated. It has been found, however that the transport reaction can be carried out even if the element to be transported, i.e., tin in this case, is applied to another material or is alloyed with another metal. There are many possibilities for doing this. One possibility consists of placing tin on a tube of ceramic sponge. In order to avoid wetting difficulties, the tin will preferably be evaporated onto the ceramic sponge. A sufficient amount of tin can be evaporated within an hour in a high vacuum at a tin temperature of about 1000° C and a temperature of the ceramic sponge of about 900° C. A further possibility consists of using a tube of a tin rich alloy as the tin source, e.g., a tin rich copper-tin alloy with at least 25% by weight of tin. Such a tube can be made, for instance, by casting. When using this alloy the tin is transported from the more tin rich alloy, which serves as the tin source, to the conductor structure, which contains less tin. It is also possible to tin-plate a fine-mesh screen of thin high-quality steel (e.g., with wire 0.3 mm thick and a mesh size of about 0.1 mm) at, for example, 900° C in a vacuum, bend it into a tube and use it in this form as a tin source. The temperature for the transport reaction in this case is advantageously about 700° C. Instead of a tubular source an elongated tin filled quartz boat, above which the conductor structure wound on the ceramic tube can be turned, if necessary, may be used. With a tubular tin source, such turning, which may be difficult under vacuum conditions, is not necessary, however.

In order to produce layers of uniform thickness of the intermetallic superconductive compound, it is also possible to supply the second element of the compound until the cores of the first element, which are embedded in the matrix, are converted completely into the superconductive compound, i.e., over their entire cross section. Unevenness or excess of the second element in the matrix that may remain subsequently can then preferably be removed by cooling part of the ampoule relative to the conductor structure, so that the second element is transported by a chemical reaction from the matrix to the cooler part of the ampoule along the temperature gradient.

EXAMPLE 2

Other transport agents, e.g., water, can also be used instead of hydrochloric acid to transport the tin, as will be explained more fully in the following. An $Nb_3Sn$ multi-core conductor was fabricated as in Example 1. After evacuating the ampoule to a residual gas pressure of $10^{-6}$ Torr, however, the ampoule was filled not with hydrochloric acid but with water vapor with a pressure of about 20 Torr at room temperature and was sealed again. The ampoule was then heated to 750° C for 64 hours to perform the transport reaction, was subsequently cooled down and opened. Close examination showed 13 mg of tin had been transferred from the tin source to the conductor structure. The copper matrix was converted into the homogeneous α-phase of the copper-tin system. On the surfaces of the niobium cores $Nb_3Sn$ layers about 1 μm thick had been formed. Here, also, the tin transport was accomplished by a "reactive transport reaction", for which the following reaction equilibrium can be assumed:

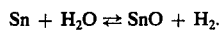

$$Sn + H_2O \rightleftarrows SnO + H_2.$$

As a comparison of the reaction times and of the transported quantity of tin between Examples 1 and 2 shows, however, tin is not transported as well by water as by hydrochloric acid. Hydrochloric acid is therefore a preferred transport agent for tin.

EXAMPLE 3

In this example the manufacture of a V₃Ga multi-core conductor whose matrix consists of a copper-gallium alloy before the transport reaction will be described. The transport reaction must merely replenish the gallium in the matrix which is used up in the formaton of the V₃Ga layers, so that the thickness of the V₃Ga layers produced is not limited by gallium depletion in the matrix.

To fabricate the multi-core conductor, a vanadium rod with a diameter of about 10 mm was first placed in a tube of a copper-gallium alloy with 18 atom percent of gallium, remainder copper, and an outside diameter of about 20 mm. This structure was then processed into a wire with an outside diameter of about 1 mm by cross-section reducing cold working steps. Because of the relativey high gallium content of the copper-gallium alloy, an intermediate anneal (30 minutes at about 550° C) was performed after each deformation by 30%. Sixty-one wire sections obtained in this manner were then placed in a tube of the same copper-gallium alloy and worked, reducing the cross section (with intermediate anneals after each 30% of deformation) until a conductor structure with an outside diameter of 0.4 mm was obtained whose individual vanadium cores had an average core diameter of about 37 $\mu$m and an average core spacing 7 $\mu$m.

Figure 5:
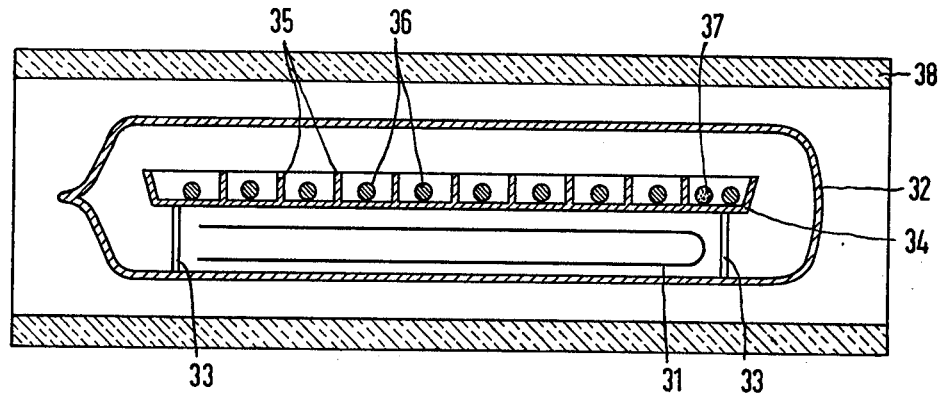

As shown schematically on FIG. 5, a section 31 of this conductor structure in wire form, 33 cm long, was bent in U-shape (since this shape is particularly suited for measurement purposes) and placed in a quartz ampoule 32 about 270 mm long with an inside diameter of about 24 mm. Above the section of wire 31, a quartz boat 34, which is divided into ten compartments by partitions 35, was arranged on a stand 33. A total of 16 mg gallium was placed in these compartments in ten portions 36. The partitions 36 prevented the gallium, when it was melted, from being distributed unevenly in the boat should the ampoule be slightly inclined. As a result the gallium source is uniformly distributed in the ampoule in such a manner that the transport paths to the different parts of the wire section 31 are of about equal length. In addition, a supply 37 of about 3 mg CuI was placed in one compartment of the boat 34. This compound reacts quantitatively with the melted gallium to form gallium iodide at elevated temperature. In contrast to the extremely hygroscopic iodides GaI and GaI₃, the chemically very stable CuI is insensitive to moisture and can therefore be dosed very acccurately. Elemental iodine, of course, could also be weighed in as the transport agent, but considerable losses occur when the ampoules are evacuated, because of its high vapor pressure. Furthermore, the vacuum pumps would have to be protected by filters or cooling traps against the entry of the highly reactive iodine vapor.

After the CuI supply was put in place the ampoule 32 was flushed with argon, evacuated down to a residual gas pressure of about 1 Torr of argon, and sealed. Subsequently, the ampoule was heated in a tube furnace 38 to a temperature of 660° C for 49 hours to carry out the transport reaction; this temperature is sufficient to form V₃Ga. After the ampoule was cooled down and opened, close examination showed that about 12 mg of gallium had been transferred from the gallium supply 36 to the wire section 31. The gallium content of the copper-gallium matrix remained practically the same, the V₃Ga layers about 4 $\mu$m thick had formed on the surfaces of the vanadium cores. The section of the wire exhibited a critical current of 90 A at a temperature of 4.2 K in a magnetic field of 5 Tesla. Control samples of the same conductor structure, which were annealed under conditions otherwise the same but without gallium replenishment by the transport reaction, i.e., without a gallium and CuI supply, had critical currents of only 19 to 22 A at the same temperature and in the same magnetic field.

It seems that in this Example the equilibrium

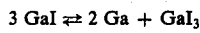

describes the transport reaction, which is shifted at the surface of the gallium source in favor of volatile GaI and at the copper or copper-gallium surface of the conductor structure, in favor of gallium and likewise volatile GaI₃.

In the manufacture of V₃Ga multi-core conductors, it is also possible to start out, of course, with a conductor structure in which the vanadium cores are embedded in a gallium free copper matrix. It is possible to first change the copper matrix by a chemical transport reaction into a copper-gallium matrix and subsequently form the V₃Ga layers on the vanadium cores while further maintaining the transport reaction for replenishing gallium. Since an enrichment of the copper matrix with gallium is first necessary, the reaction time and the gallium supply must, of course, be made more ample than in the example described above. The enrichment of the matrix and the formation of the V₃Ga layers can be accomplished, for instance, at a uniform temperature of about 660° VC. It is also possible, however, to enrich the matrix at a temperature below that at which V₃Ga is formed, e.g., at 600° C, and to increase the temperature to, for instance, 660° C for the subsequent formation of the V₃Ga layers. To the extent possible, only as much gallium as can diffuse into the matrix for forming or maintaining a homogeneous single-phase alloy, preferably of the $\alpha$-or $\xi$-phase of the copper-gallium system should be transported to the matrix when the matrix is being enriched. This can preferably be achieved by using transport agent amounts as small as possible. Excessive amounts of transport agent leads to too large a gallium supply, which again results in the formation of very gallium rich layers, particularly of the $\gamma$-phase, at or near the matrix surface. Such layers, however, are undesirable as voids are left in the matrix during its homogenization in the course of the further heat treatment.

Instead of pure gallium, gallium alloys can also be used as the gallium source, preferably copper-gallium alloys with a gallium content higher than that of the conductor structure to be treated, e.g., a copper-gallium alloy with 32 atom percent of gallium. With uniform temperature, a concentration equalization between the gallium rich and the gallium poor alloys is brought about. Such concentration equalization also promotes the homogenity of the gallium distribution in the conductor structure, for instance, in the method described in Example 3.

EXAMPLE 4

Figure 6:
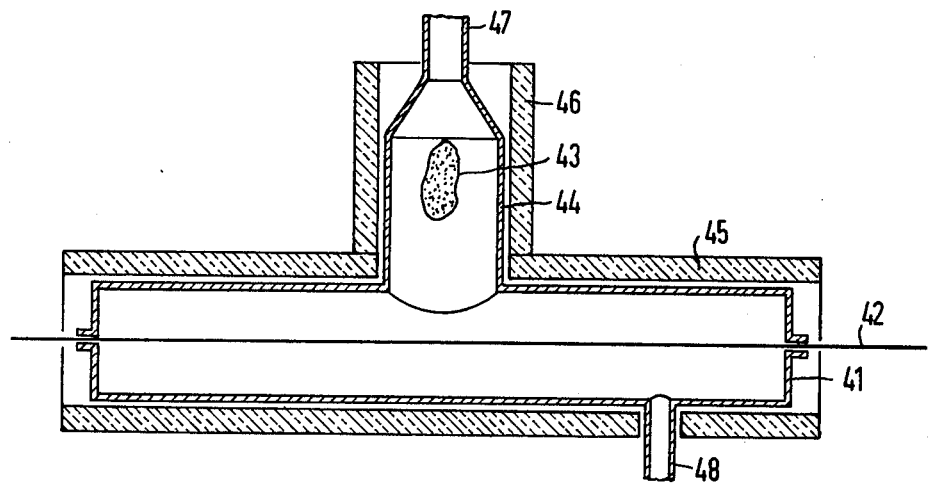

As noted above, the method of the present invention can also be carried out in an open system. Apparatus suitable therefor is schematically shown in FIG. 6. This apparatus consists, among other things, of a reaction tube 41, through which a conductor structure 42 to which an element is to be supplied by a chemical transport reaction can be pulled. A supply 43 of this element to be added is provided in a supply tube 44 coupled to the reaction tube 41. Both tubes are surrounded by tubular furnaces 45 and 46. The transport agent is supplied through a nozzle 47, and excess gas discharged by a nozzle 48. In order to avoid excessive pressure differences at the feedthroughs for the conductor structure 42 through the reaction tube 41 and thereby sealing problems, the transport reaction is advantageously carried out in an inert gas, e.g., a rare gas such as argon, which can be supplied along with the transport medium through the nozzle 47. For example, to continuously fabricate an $Nb_3Sn$ multi-core conductor, a conductor structure about 500 $\mu$m wide and about 150 $\mu$m thick in ribbon form with a copper matrix and 60 niobium cores with a diameter of about 10 um each can be used as the conductor structure 42, which is manufactured in a manner similar to the conductor structure used in Example 1. After the apparatus is flushed with inert gas, the tin supply 43 can be heated, for instance, to about 780° C and the reaction tube 41 with the conductor structure 42, to about 750° C, so that the transport reaction takes a nearly isothermal course. Then, a gas mixture of, for instance, 10 1/hr of argon and 0.5 1/hr of hydrochloric acid gas is conducted through the tube nozzle 47 over the tin supply. Of the reaction tube 41 is about 1 m long, the conductor structure 42 can be pulled through the reaction tube with a velocity of about 3 m/hr. In this process, tin is transported from the tin supply 43 to the conductor structure 42, through which the copper matrix is converted into the homogeneous $\alpha$-phase of the copper-tin system and $Nb_3Sn$ layers are formed at the surface of the niobium cores.

Another possibility for operation in an open system is to omit the gas exhaust nozzle 48 and supply only as much transport agent as is lost at the feedthroughs for the conductor structure 42 through the reaction tube 41 due to leaks through the tube nozzle 47. It is then possible to also distribute the tin supply uniformly inside the reaction tube 41 along the conductor structure 42, for instance.

As already mentioned, the method of the present invention is suited not only for the manufacture of superconductors in wire form, but also for the manufacture of superconducting structures of different forms. For example, a superconducting shield plate or a superconducting shielding cylinder with a $V_3Ga$ layer can be fabricated using a vanadium plate or a vanadium cylinder with a copper layer on one side with gallium supplied to the arrangement thus obtained through a chemical transport reaction with iodine at a temperature of about 600° C. The gallium then diffuses into the copper layer and reacts with the adjacent vanadium, forming a $V_3Ga$ layer. On the copper-free side of the vanadium component, on the other hand, practically no reaction between vanadium gallium takes place under the stated conditions, so that no $V_3Ga$ layer is formed thereon.

The first structural part with a higher melting point element of the compound to be produced need not necessarily consist of a single metal but may also contain additions if desired. For instance, titanium, zirconium or tantalum can also be admixed to the niobium in quantities of up to about 30% by weight. Additions of hafnium are also possible. As the first structural, a vanadium-niobium alloy, for instance, can also be used. These and other modifications may be made without departing from the spirit of the invention which is intended to be limited by the appended claims.

1. A method for the manufacture of a superconductor with a superconductive intermetallic compound consisting of at least two chemical elements by steps comprising bringing a ductile structural part made of at least one element of the compound into contact with a second structural part which contains a ductile carrier metal for the remaining elements of the compound; subsequently supplying the remaining elements of the compound to the second structural part at elevated temperature; and diffusing the remaining elements through the second structural part and reacting said remaining elements with said first structural part to form the compound, wherein the improvement comprises performing said step of supplying so as to supply the remaining elements to the second structural part solely by a chemical transport reaction of the type in which said remaining elements are initially converted by a gaseous transport agent in a reversible reaction to form gaseous reaction products and the gaseous reaction products subsequently decomposed in a reversal of the reaction to thereby supply the remaining elements to the second structural part.

2. The method according to claim 1 wherein several cores of said first structural part are embedded in a matrix material of said second stuctural part and the resulting structure reduced in cross-section in a number of steps and wherein the chemical transport reaction is carried out after the last cross-section reducing step.

3. The method according to claim 1 wherein the superconductive compound to be produced is a compound of the type $A_3B$ with an A-15 crystal structure, consisting of two elements, and the first structural part consists of the higher melting point element of the compound, with the lower melting point element supplied through the transport reaction.

4. The method according to claim 1 wherein the second structural part consists only of the carrier metal for the remaining elements.

5. The method according to claim 1 wherein the second structural part also contains a share of the remaining elements of the compound to be produced.

6. The method according to claim 1 wherein said carrier metal is copper.

7. The method according to claim 1 wherein the transport reaction is carried out in a closed system.

8. The method according to claim 1 wherein the transport reaction is carried out in an open system.

9. The method according to claim 1 wherein the source for the element to be transported in the transport reaction and the conductor structure containing the second ductile component part are kept at least approximately at the same temperature.

10. The method according to claim 1 wherein the compound $Nb_3Sn$ is formed.

11. The method according to claim 10, wherein the first structural part consists of niobium and the second structural part of copper with 0 to 8.5 atom percent of tin.

12. The method according to claim 11 where 0 to 4 atom percent of tin is used.

13. The method according to claim 10 wherein chlorine is used as the transport agent for the tin.

14. The method according to claim 13 wherein said chlorine is introduced into the reaction chamber in the form of hydrogen chloride.

15. The method according to claim 10 wherein the transport reaction is carried out at a temperature of between 700° and 800° C.

16. The method according to claim 1 wherein the compound $V_3Ga$ is formed.

17. The method according to claim 16 wherein the first structural part consists of vanadium and the second structural part of copper with 0 to 23 atom percent of gallium.

18. The method according to claim 17 wherein said second component part contains 0 to 15 atom percent of gallium.

19. The method according to claim 16 wherein iodine is used as the transport agent for the gallium.

20. The method according to claim 19 wherein the iodine is introduced into the reaction chamber in the form of copper iodide.

21. The method according to claim 16 wherein the transport reaction is performed at a temperature of between 450° and 700° C.

22. The method according to claim 7 wherein the source for the element to be transported is distributed over the reaction chamber as uniformly as possible in such a manner that the transport paths to the different parts of the conductor structure containing the second structural part are of about equal length.

23. The method according to claim 9 wherein the source for the element to be transported is distributed over the reaction chamber as uniformly as possible in such a manner that the transport paths to the different parts of the conductor structure containing the second structural part are of about equal length.

24. The method according to claim 23 wherein the source for the element to be transported encloses the conductor structure in the form of a tube.

25. The method according to claim 1 wherein the transport reaction is controlled so that the second element is transported to the surface of the second structural part only in such an amount as can diffuse into the second structural part, forming or maintaining a homogeneous single-phase alloy.

26. The method according to claim 1 and further including an additional heat treatment in an inert atmosphere, to reinforce the layers of the intermetallic compound formed after the transport reaction is completed.

27. The method according to claim 1 wherein the second structural part is enriched with the second element of the compound at a temperature below the formation temperature of the compound in a first phase of the transport reaction and the compound is formed at a temperature above the formation temperature of the compound, while continuing to supply the second element of the compound in a second phase.

28. A method for the manufacture of a superconducting with a superconductive intermetallic compound consisting of at least two chemical elements by steps comprising bringing a ductile structural part made of at least one element of the compound into contact with a second structural part which contains a ductile carrier metal for the remaining elements of the compound; subsequently supplying the remaining elements of the compound to the second structural part at elevated temperature; and diffusing the remaining elements through the second structural part and reacting said remaining elements with said first structural part to form the compound, wherein the improvement comprises:
   a. disposing said first and second structural parts, after being brought together, in a reaction chamber;
   b. also disposing within said reaction chamber the remaining elements;
   c. providing a supply of chemical transport agent for said remaining elements in said reaction chamber;
   d. heatimg said reaction chamber to cause said chemical transport agent to carry out a chemical transport reaction solely of the type in which said remaining elements react in a reversible reaction with the gaseous transport agent to form gaseous products which are subsequently decomposed in a reversal of the reaction at said second structural part, whereby said remaining elements are supplied to said second structural part by means of a chemical transport reaction; and
   e. maintaining said transport reaction for a predetermined period of time so as to supply a desired amount of said remaining elements to said second structural part.

* * * * *